United States Patent [19]

Long et al.

[11] 4,305,034

[45] Dec. 8, 1981

[54] MAGNETIC FIELD INTENSITY MEASURING DEVICE WITH FREQUENCY CHANGE INDICATION

[75] Inventors: James C. Long, Pasadena; Monroe J. Willner, Santa Ana; William R. Good, Carlsbad, all of Calif.

[73] Assignee: Hughes Aircraft Company, Culver City, Calif.

[21] Appl. No.: 27,970

[22] Filed: Apr. 9, 1979

[51] Int. Cl.³ ............................................. G01R 33/02
[52] U.S. Cl. .................................... 324/253; 324/258; 331/65
[58] Field of Search ................ 324/244, 249, 253–255, 324/258, 260, 117 R; 331/65, 114, 108 D, 111, 112, 113 R, 113 A, 116 FE, 117 FE

[56] References Cited

U.S. PATENT DOCUMENTS

| | | | |
|---|---|---|---|
| 2,991,414 | 7/1961 | Tillman | 324/253 |
| 3,040,247 | 6/1962 | Van Allen | 324/253 |
| 3,210,689 | 10/1965 | Burwen | 331/114 X |
| 3,356,963 | 12/1967 | Buck | 331/114 X |
| 3,416,072 | 12/1968 | Fussell et al. | 324/249 |
| 3,768,011 | 10/1973 | Swain | 324/253 |
| 3,890,580 | 6/1975 | Kuhn et al. | 331/116 FE |
| 4,053,849 | 10/1977 | Bower et al. | 331/65 |

*Primary Examiner*—Gerard R. Strecker
*Attorney, Agent, or Firm*—Leonard A. Alkov; W. H. MacAllister

[57] ABSTRACT

A device powered by a DC source produces an output signal the frequency of which changes as a function of changes in external magnetic fields sensed by such device. A pair of non-linear amplifiers are interconnected so that the output of one amplifier is the input of the other amplifier. An inductive sensor is connected between the outputs of the amplifiers. The inductive sensor has an elongated magnetic core and a coil is wound on the core. The voltages at the outputs of the amplifiers, across the inductive sensor, switch between zero and the full voltage of the DC source.

1 Claim, 8 Drawing Figures

Fig. 5.
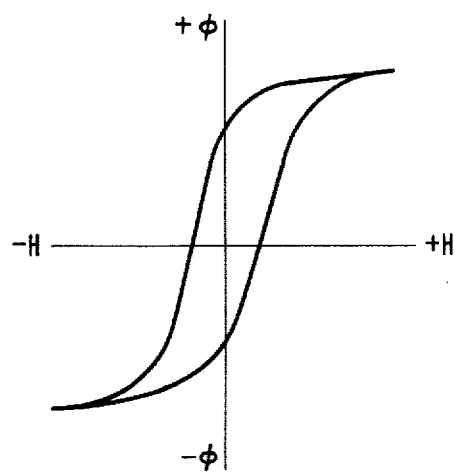
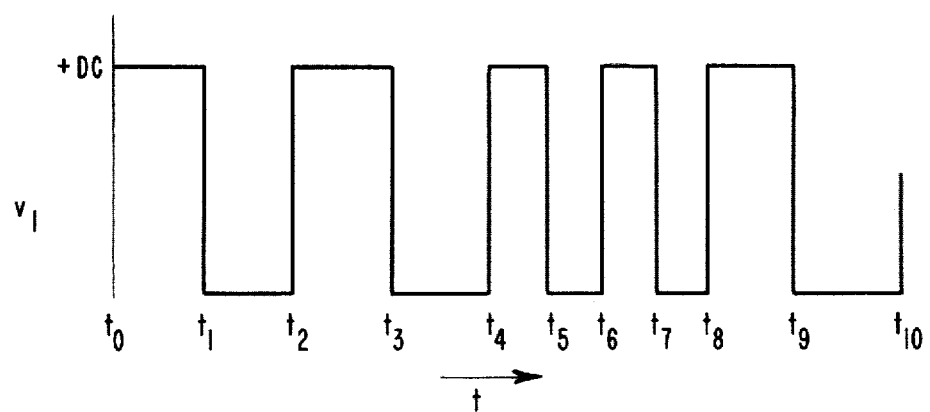
Fig. 6.

MAGNETIC FIELD INTENSITY MEASURING DEVICE WITH FREQUENCY CHANGE INDICATION

DESCRIPTION

BACKGROUND OF THE INVENTION

This invention relates to devices which are adapted for detecting changes in the strength or intensity of magnetic fields and more particularly to such devices which are suited for use in magnetically sensitive fuzes.

Prior art devices for sensing changes in the strength of magnetic fields include flux gate type magnetometers which have been used in anti-tank and anti-vehicle mines. One such magnetometer utilizes a magnetic sensor having a sensing coil wound on a toroidal tape type magnetic core. The sensor is generally designed to operate over the entire flux-field hysterysis loop of its core so that when flux excursions along the hysterysis loop occur in response to large induced voltages due to large external magnetic field disturbances created by external sources, the sensor core saturates with magnetic flux. At the saturation points of the hysterysis loop the flux rate of change with respect to the magnetic field is small, but as the core comes out of saturation such flux rate of change increases in proportion to the slope of the hysterysis loop. If the slope is steep, the increase in flux rate of change and consequently the induced voltage in the sensor coil is high. The induced voltage in the sensor coil is amplified and rectified so as to convert it to a varying DC voltage.

In these flux gate magnetometers, the presence of a vehicle or tank is identified by the particular pattern of the varying DC voltage resulting from disturbance of the earth's magnetic field due to the presence of such vehicle or tank.

Such flux gate magnetometers suffer from long warm-up periods, in the order of 45 seconds, required to permit the magnetometer electronics sufficient time to stabilize, and hence important data could be lost during such warm-up periods. Also such magnetometer utilizes a reference voltage which is dependent upon previously obtained data from external magnetic field changes, and the circuit providing the reference voltage also takes a long time to stabilize. Due to the long warm-up time requirements, if the magnetometer is duty cycled at low on-to-off ratios, the data samples are far apart in time, and short duration data resulting from rapidly passing vehicles in proximity of the magnetometer sensor, will not be detected.

Additionally, the output signal from a flux gate magnetometer is in analog form and it must first be processed into digital format by an A/D converter before a microprocessor or computer can analyze the data. It is also difficult and costly to construct such magnetometer because the sensor coil is wound on a toroidal core upon which a coil with many layers is required, and toroidal cores are difficult to wind.

Further, the circuit of the flux gate magnetometer has a high degree of unreliability designed into it by virtue of having a large number of electronic components.

Importantly, the sensor of the flux gate magnetometers having a toroidal core, suffers from lack of magnetic field directivity, since such sensor responds to field vectors in more than one direction, such as vertical, lateral and radial field vector components.

Another prior art magnetometer used for sensing changes in magnetic fields is of the digital type. This type of magnetometer has a complex magnetic sensor having a core constructed from glass laminate substrates with a magnetic film deposited on each of the laminates. A coil is then wound on the glass laminate core. The electronics associated with the digital type magnetometer consists of an L-C sinusoidal oscillator wherein the L represents the coil of its sensor and the C is a capacitor in parallel with the sensor coil forming a parallel resonant circuit, wherein the LC circuit values determine the sinusoidal oscillation frequency. The output of the oscillator together with a signal from an accurate time base generator are fed into a logic AND gate. The output of the AND gate is fed into counters which count the frequency or repetition rate of the L-C oscillation. The frequency of oscillation is modulated when the inductance of the L-C tank circuit undergoes a change in inductance value due to the sensor being subjected to a change in an external field. This type of magnetometer requires additional magnets which are used to magnetically bias the glass laminate core to a sensitive area of its $\phi$-H (magnetic flux versus magnetic field) hysterysis loop.

In view of its glass laminate sensor core construction, the digital magnetometer is unduly complex and costly to fabricate and structurally fragile. Additionally, the required biasing magnets further increase the sensor's complexity as well as it unreliability, and as in the case of the flux gate magnetometer, the digital type of magnetometer also has a large quantity of electronic components which degrade its reliability.

In the digital magnetometer, performance-wise, a change in external magnetic field will not produce a large change in frequency of the L-C oscillator, and consequently this magnetometer is basically a low sensitive device. It has been experimentally determined that when the flux in the coil of the LC oscillator, as measured by a gaussmeter, changed one-half gauss, the frequency of oscillation changed only by one-tenth of a percent.

Invention Summary

The broad objectives of this invention are therefore to overcome the limitations and deficiencies of prior art magnetometers such as the above discussed flux gate type or digital type.

Hence, one objective of this invention is to provide a magnetometer which exhibits a high directivity.

Another objective of this invention is to provide a magnetometer which incorporates a comparatively thin diameter or elongated magnetic sensor core which provides increased sensitivity to magnetic fields along the axis of elongation of the sensor core.

A further objective of this invention is to provide such electronic circuits as part of the magnetometer which will enable direct processing of incoming digital data without the use of an analog to digital converter between the magnetometer's output and a digital computer input.

Still a further objective of this invention is to avoid the use of complex and fragile magnetic cores as used in some prior art magnetometer sensors.

Yet a further objective of this invention is to provide a magnetometer which utilizes a sensor comprising a simple straight magnet by which it is more economical to construct the core, and easier to wind the requisite number of winding layers.

A still further objective of this invention is to provide a magnetometer which does not need sensor core biasing magnets, which avoids the use of glass laminate cores with magnetic films thereon and which has a simplified sensor structure.

Another objective of this invention is to reduce the quantity of electronic parts required, so as to increase the reliability of the magnetometer.

Still another objective of this invention is to increase the pulse width of the current pulses flowing in the sensor coil of the magnetometer and reduce the current level of each pulse so as to minimize electromagnetic radiation from the sensor's coil so as to make the magnetometer more difficult to detect.

A still further objective of this invention is to reduce the warm-up time of the magnetometer circuit by avoiding the need of a reference voltage source thereby increasing the magnetometer's capability of being duty cycled at low on-to-off ratios, and thereby avoiding loss of valuable data, which may occur during such long warm-up periods, and consequently providing the capability of sensing rapidly passing targets in proximity of the magnetometer's sensor.

A still further objective of this invention is to provide a simplified but reliable electronic magnetometer circuit which together with the magnetometer sensor will produce a large change in the frequency of oscillation of the magnetometer circuit for a small external field disturbance. In furthering this objective, elimination of the capacitor in parallel with the sensor coil of the prior art digital type circuit was necessary so that frequency of oscillation would be dependent upon the inductance of the sensor and the non-linear characteristics of the inverter circuits used in the magnetometer of the subject invention.

Accordingly, a magnetometer device is provided for producing changes in the frequencies of oscillation of an output signal due to a change in an external magnetic field. Such device employs a sensor which consists of only an inductive element having an elongated and relatively thin magnetic core, generally made of permalloy, upon which a coil of copper wire is wound. Such a sensor has extremely high directivity and sensitivity to magnetic field vectors along the axis of elongation of its core. This sensor is connected to both outputs of a pair of CMOS inverters of the electronic circuit type as is commonly used in logic circuitry.

Cross-coupled feedback paths are provided from the output terminal of one inverter to the input terminal of the other inverter. The electronic circuits have inherent non-linear resistance which effects relatively large changes in oscillation frequency of the device for small changes in external magnetic fields or field disturbances.

One of the electronic circuit inverter outputs is also connected to a frequency change recognizer subsystem for reading out frequency changes of oscillation of the magnetometer circuit due to a change of an external magnetic field detected by the magnetometer sensor.

BRIEF DESCRIPTION OF THE DRAWINGS

FIGS. 3-6 represent certain functional relationships encountered during performance of the system of FIG. 1.

DETAILED DESCRIPTION OF THE INVENTION

Figure 1:
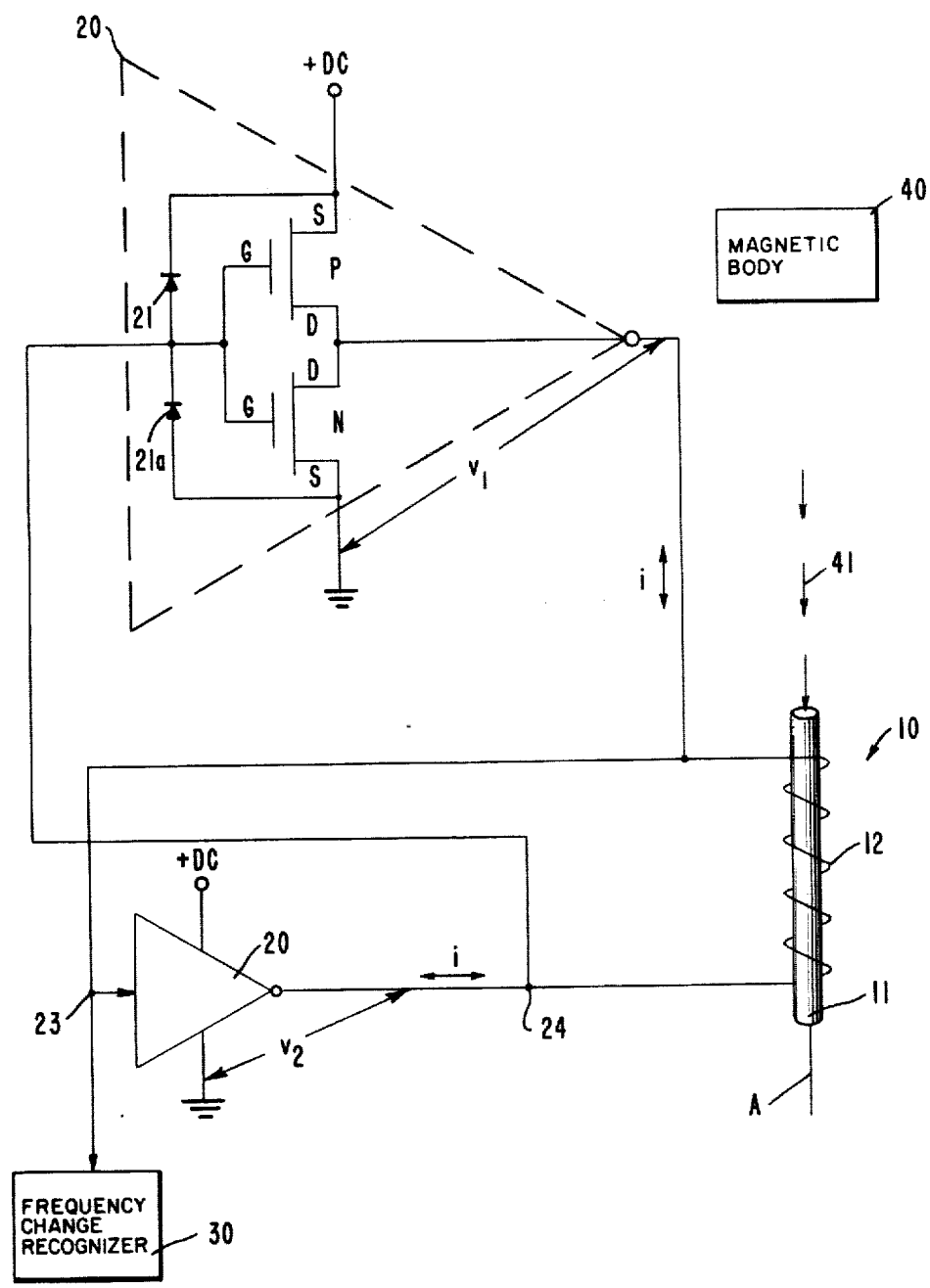
FIG. 1 is a schematic of the system illustrated in accordance with the invention.

The embodiment of the invention shown in FIG. 1 includes a pair of identical inverter electronic circuits 20, each of which is composed of a P-channel and a N-channel field effect transistor connected so that their drains form a common electrical junction and their gates are connected in parallel. Diodes 21 and 21a are connected between a common input gate junction and the sources of both transistors, such that the cathode of diode 21 is connected to the source of the P-channel transistor and the anode of diode 21a is connected to the source of the N-channel transistor. Each of circuits 20 is fed by a battery (not shown), the positive side of the battery (designated as +DC in FIG. 1) is connected to the source of the P-channel transistor and the negative side of the battery which is grounded is connected to the source of the N-channel transistor. Inverters 20 are conventional CMOS devices such as made by RCA as type CD 4007.

Magnetic sensor 10 is provided as an integral part of this device having a coil 12, one end of the coil being connected to the output of one inverter and the other end being connected to the output of the other inverter.

Sensor 10 comprises magnetizable core 11, made of a magnetic material such as permalloy, and is generally a straight or 180°-shaped core. The coil is wound with a generally thin gauge copper wire such as gauge 40 through 44, and it has been experimentally determined that approximately 5,000 turns of such wire provides an adequate sensor coil. One end of coil 12 is connected to junction 23 and the other end of the coil is connected to junction 24. Junction 23 also represents the output of one of circuits 20 as well as the input of the other circuit 20, and also an input to a frequency change recognizer device 30.

It should be noted that the core 11 is shown with a longitudinal axis A, which will become an important consideration in the subsequent discussion relating to magnetic field disturbances caused by an external body 40. A representative magnetic field vector 41 is indicative of the earth's magnetic field and is shown in FIG. 1 as being magnetically coupled to sensor 10. It should be noted that such magnetic field vector 41 is in line with axis A and will be subsequently referred to as of the 0° magnetic field vector with respect to axis A of sensor 10.

Each of circuits 20 provides a current source or a current sink at its output depending upon whether the input voltage thereto is below or above the half voltage point of the power supply positive DC voltage applied to each of such circuits. The relationship between the output voltage and current of each circuit 20 is controlled by the circuit's inherent non-linear resistance, hereinbelow referred to as $R_n$, whose value is a function of both the input voltage and the output current of circuits 20.

Figure 2:
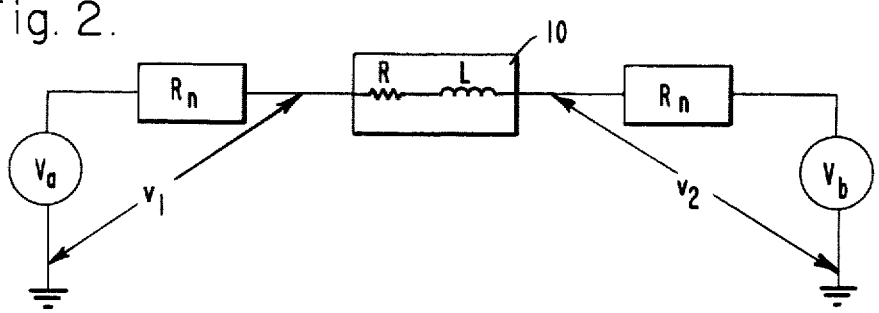
FIG. 2 is an equivalent circuit of the system of FIG. 1 to enable a technical discussion of the operation of the inventive system to be made.

The inherent non-linear resistance function may be expressed in terms of:

$$R_n = f\left(\frac{v_1 - v_a}{i}\right) = f\left(\frac{v_2 - v_b}{i}\right), \quad (1)$$

so that $R_n$ is a function of the difference between $V_1$ and $V_a$ divided by current i circulating in winding 12, or a function of the difference between $v_2$ and $v_b$ divided by current i, wherein such relationship will become more apparent in discussion of the equivalent circuit of FIG. 1, represented by FIG. 2 and where, in such equivalent circuit, $$\begin{aligned}v_a &= f(v_2) \\ v_b &= f(v_1).\end{aligned} \quad (2)$$

It should be noted that in the equivalent circuit of FIG. 1, represented by FIG. 2, each of circuits 20 is shown to possess its own non-linear inherent resistance $R_n$, and the impedance $Z_L$ of sensor 10 is composed of an inductance L and a series resistance R. Resistance R is comparatively small compared to the reactance of L and hence impedance Z will be dominated by its inductive reactance component. The non-linearity of inductance L will be discussed hereinbelow.

The output of one non-linear circuit 20 is connected to the input of the other one, thus producing positive feedback and having the effect of making one circuit output voltage greater than half the DC power supply voltage, and providing a source of current from that circuit 20. The output voltage of the other circuit 20 would thus be lower than half the DC power supply voltage providing a sink for current therefrom.

If sensor 10 were not connected between junctions 23 and 24, such junctions would be open-circuited, and one of junctions 23 or 24 would remain at +DC and the other junction at 0 volts, indefinitely.

The presence of sensor 10 causes the FIG. 1 system to oscillate. At the start of each half cycle of oscillation, current i is zero. The presence of voltage $v_1 - v_2$ across junctions 23-24 causes current i to increase. At any time subsequent to the start of the half cycle, the current through winding 12 may be expressed as:

$$i = \int_0^t \frac{(v_1 - v_2)}{L} dt, \quad (3)$$

where $v_1$, and $v_2$ and L are non-linear functions discussed below. It should be noted that operation of this device would be principally on extreme portions 26 and 27 of the curve shown in FIG. 3.

As the current i rises, the P-channel transistor pulls current from the +DC terminal, and the output voltage between junction 23 and ground slowly drops below +DC value, and at that time the N-channel transistor in the other circuit 20 drains current from sensor 10 into ground causing the output voltage of such other circuit 20 to rise slowly above zero volts. When current i in sensor 10 reaches the limiting value of circuits' 20 current capacity, output voltage $v_1$ rapidly falls toward zero volts, and the output voltage $v_2$ rapidly rises toward +DC volts. When these voltages reach +DC/2 volts, the roles of these circuits 20 are reversed. Sensor 10 tries to maintain the magnitude and direction of current flow that prevailed before circuits 20 reversed their above described functions. Sensor 10 thus temporarily becomes the driving force of current i and switches the relative voltage polarities across terminals 23-24 simultaneously with circuits' 20 reversal of functions. Sensor 10 discharges current i into a DC power source, denoted as +DC, via diode 21 until its magnetic flux collapses to zero. The next half cycle of oscillation then proceeds in a similar fashion except with reversed polarities of sensor's 10 terminals 23-24 in order to drive current i in the opposite direction to that of the previous half cycle of oscillation.

Figure 3:
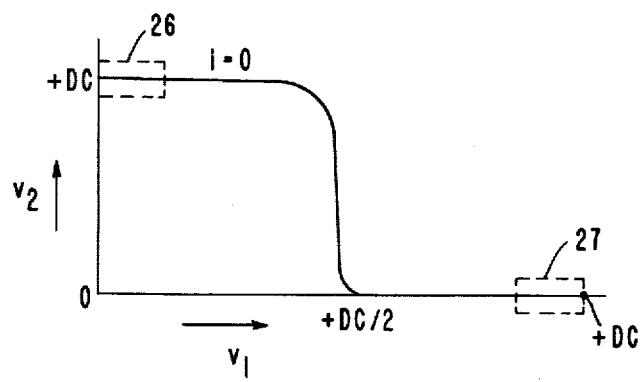

FIG. 3 shows the relationship between the open circuit output voltage $v_1$ as present between terminal 23 and ground, and voltage $v_2$ which is the output voltage of the lower circuit 20, shown in FIG. 1, but is also the input voltage to the upper circuit 20 of FIG. 1 and present between terminal 24 and ground. As noted above, the $v_1$ and $v_2$ operating points are at the extreme ends of the curve in FIG. 3, denoted as locations 26 and 27. Hence when i=o, either $v_1$ or $v_2$ will be zero or +DC. That is, one of $v_1$, $v_2$ would be zero, when the other of $v_1$, $v_2$ would be +DC. Such relationship sets up the initial conditions to enable current i to start increasing from its zero potential value.

Figure 4:
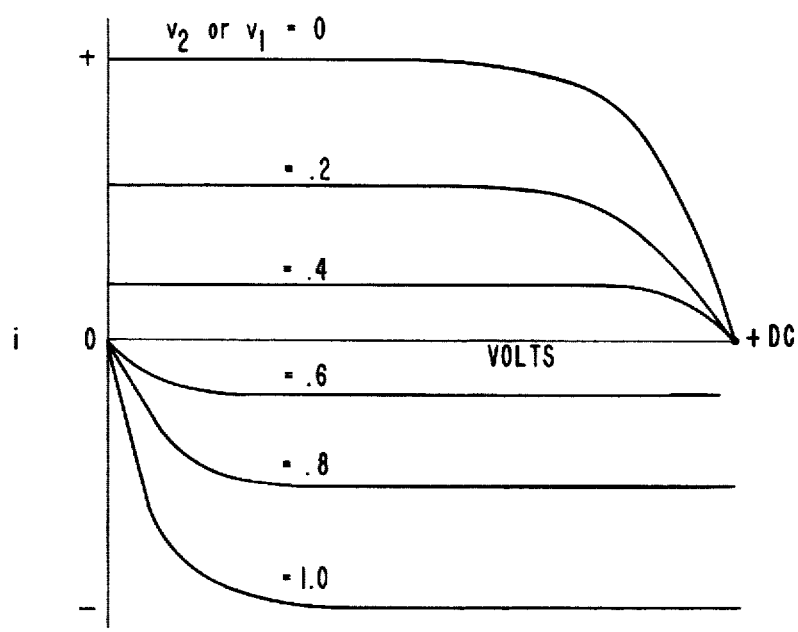

FIG. 4 shows a family of equipotential curves for the DC applied voltage versus i relationship for either of circuits 20. It can be seen from the curves above the zero abscissa line, that when current i is drawn from +DC source, output voltages $v_1$ or $v_2$ are close to +DC maximum value. For small current quantities, the output voltages $v_1$ or $v_2$ decline rapidly towards their zero level. The maximum current limit is controlled by the input voltage such as between node 23 and ground which is also the output voltage $v_1$ of the other of circuits 20.

It can be seen from the curves below the zero abscissa line, that when current i is fed into the ground terminal, output voltages $v_1$ or $v_2$ are close to zero volts for small current quantities of i. As current i increases to its maximum limit, output voltages $v_1$ or $v_2$ increases rapidly toward a +DC level. The maximum current limit is controlled by the input voltage such as between node 23 and ground.

Referring also to FIG. 5, a typical hysterysis loop applicable to sensor 10 showing magnetic flux versus field intensity, is a function of the current through the sensor winding. Because of the curvature of the $\phi$-H hysterysis loop, the sensor inductance provides a non-linear function with respect to current i or with respect to the magnetic field produced by sensor 10, with or without the presence of any magnetic type body, such as body 40 in proximity of sensor 10.

Accordingly, as seen from equation (3), current i will be an integral function of the difference between $v_1$ and $v_2$ divided by the sensor inductance L. But $v_1$, $v_2$ and L are all non-linear terms, and in particular the non-linearity of the sensor inductance with changes in current i or field intensity H, may be stated by the following expressions derived from Faraday's Law of Induction:

$$L = N \frac{d\phi}{di}; \text{ or} \quad (4)$$

$$L = \frac{N^2}{\tau} \frac{d\phi}{dH}, \quad (5)$$

where L is the inductance in henries, N is the number of turns of coil 12 of sensor 10, and $\tau$ is the magnetic path length produced by sensor 10.

Additionally, pulling current i by circuits 20 from the +DC source and draining current i to ground, will also contribute to the non-linearity function of L, by virtue of relationships stated in equations (3), (4) and (5).

Thus, interaction between voltages and current in this system causes the frequency of oscillation to be a sensitive function of the locus of the operating point on the $\phi$-H curve of FIG. 5 for each cycle of oscillation of the system of FIG. 1.

When sensor 10 is placed in an ambient magnetic field, such as the earth's magnetic field 41, the locus of the operating point on the $\phi$-H curve of FIG. 5 is displaced, and thus changes in the frequency of oscillation of the system of FIG. 1 occur. Because of the non-linear nature of circuit interaction described above, the frequency of oscillation changes to a greater extent than if sensor 10 was used in a linear L-C oscillator wherein none of the electronic circuits were driven to their respective saturation limits. Circuits 20 herein are driven to their saturation limits.

Figure 7:
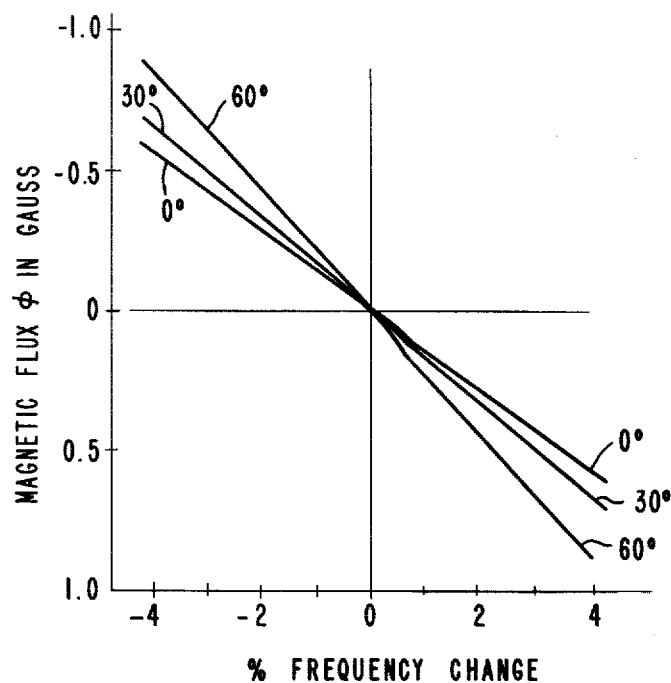
FIG. 7 is a graph of magnetic flux versus percent of frequency change in the oscillation of the system in FIG. 1 caused by external magnetic field influences. Such results as graphed were experimentally determined.

Referring also to FIGS. 6 and 7, the observed effect upon the frequency of oscillation of the system of FIG. 1 is considered in terms of $v_1$.

During time interval $t_o$ through $t_4$ the cyclic repetition rate of the system of FIG. 1 is seen to have a specific value, such repetition rate is measured by the frequency change recognizer 30, and used as the reference frequency for subsequent comparisons. During the time interval $t_4$ through $t_8$, the earth's ambient magnetic field 41 was changed by virtue of the presence of magnetic type body 40, which changed the repetition rate of oscillation. Body 40 is of magnetic character by virtue of the magnetic substances such as steel, from which it is constructed. Body 40 does not require an active magnetic field generator in order to create disturbance of vector 41, inasmuch as the magnetic materials of which body 40 is constructed is sufficient to effect such disturbance. During the latter stated interval, circuit 30 provides an output therefrom indicative of the repetition rate change. When body 40 was no longer present, the ambient magnetic field returned to its original value during the period $t_8$ and $t_{10}$ which enabled the system of FIG. 1 to again oscillate at its original repetition rate such as between $t_o$-$t_4$, which caused recognizer 30 to indicate such original repetition rate.

The effects of the ambient (external) magnetic field upon the oscillation frequency of the device of FIG. 1 is shown in the graph of FIG. 7. The measurements for the azimuth of three magnetic field vectors with respect to axis A of sensor 10 are graphed, showing that when the earth's magnetic field vector, represented at 41, is in line with the axis A, or at zero degree displacement therefrom, the magnetic flux in sensor 10 is greatest. Such flux changes and frequency changes decrease as the azimuth angle of vector 41 increases with respect to axis A, as shown in FIG. 7.

Figure 8:
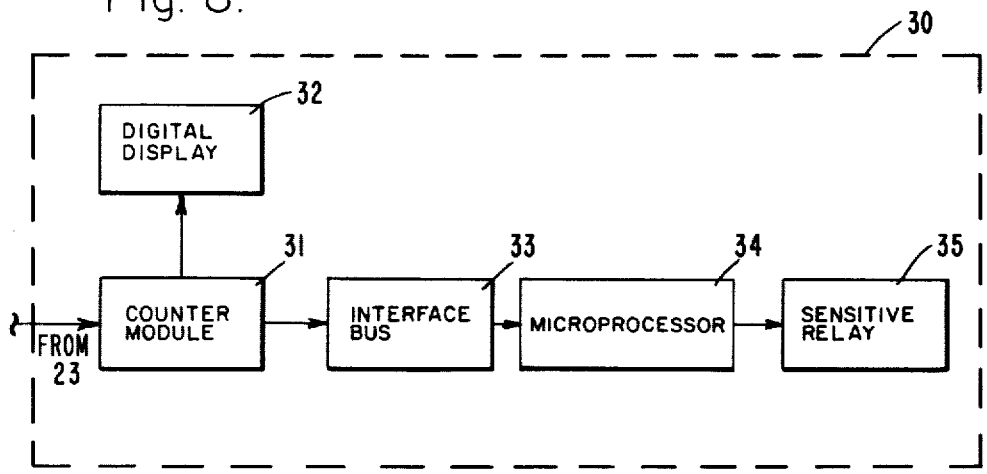
FIG. 8 is a block diagram of a frequency change recognizer as used in conjunction with FIG. 1.

Referring to FIG. 8, frequency change recognizer circuit 30 comprises commercially available equipment made by Hewlett-Packard Company of Palo Alto, Calif., consisting of their electronic units, identified as counter module 31, Model 5308A, receiving its input from junction 23 of FIG. 1 and providing an output to digital display 32, Model 5300B, and another output to the input of interface bus adaptor 33, Model 5312A. Adaptor 33 provides an input to microcomputer 34, Model 9825, which in turn provides an output to a conventional sensitive relay 35. Such relay provides closure functions to activate an external device when frequency changes in the system of FIG. 1 are detected.

Thus, when body 40 passes near sensor 10 so as to change the earth's magnetic field, as at 41, then a frequency change in oscillation of the system discussed in connection with FIG. 1, will be provided at junction 23 as an input to frequency change recognizer 30. Within recognizer 30, counter 31 counts the frequency of oscillation of the circuit of FIG. 1 in the absence of a change in the earth's (external) magnetic field 41 due to the absence of body 40 and displays the frequency in readout 32 and also stores the value of the oscillation frequency as a reference value in microcomputer 34 via the interface bus 33.

When magnetic body 40 passes in proximity of sensor 10, a magnetic field change of vector 41 will be created and induced into sensor 10, thereby changing the frequency of oscillation of the circuit of FIG. 1 as hereinabove discussed, and providing an output of the changed frequency of oscillation at terminal 23 as an input to recognizer 30. The new frequency will be processed by the same components of recognizer 30 as discussed in connection with the establishment of the reference frequency, and also stored in computer 34. The computer will now be able to compare the new frequency against the reference frequency and provide an output therefrom to the sensitive relay in logic form as a binary 1 when a change in frequency is recognized, or a binary 0 when no change in frequency is recognized, so that the relay will close to activate another device connected thereto on a binary 1 signal, or remain inactive on receipt of the binary 0 signal so as to preclude activating such other device connected to the relay.

It should be noted that the frequency change of oscillation determined by recognizer circuit 30 will be indicative of the azimuth location of body 40 with respect to axis A of sensor 10.

We claim:

1. A magnetic field measuring device adapted for being connected between first and second potentials of a direct current electrical power source and for providing a signal whose frequency of oscillation is indicative of the intensity of external magnetic fields sensed by said device, said detector comprising:
   first and second nonlinear amplifiers each of which is comprised of a P-channel field effect transistor and an N-channel field effect transistor connected in an inverter configuration such that the drains of said transistors form a first common electrical junction and the gates of said transistors are connected in parallel to form a second electrical junction;
   a core comprised of magnetic material, said core being straight in shape, so as to produce directivity of measurement of said magnetic field along the longitudinal axis of said core; and
   a coil of wire encompassing said core having one end connected to the first common electrical junction of said first nonlinear amplifier and to the second common electrical junction of said second nonlinear amplifier, and having the other end connected to the first common electrical junction of said second nonlinear amplifier and to the second common electrical junction of said first amplifier;
   wherein when the source of said P-channel field effect transistor in each of said amplifiers is connected to said power source so that said first potential is applied thereto, and the source of said N-channel field effect transistor in each of said amplifiers is connected to said power source so that said second potential is applied thereto, substantially the first and second potentials are applied across said coil with the direction of current through the coil reversing at a switching rate which is indicative of the intensity of external magnetic fields sensed by said device.

* * * * *